United States Patent

Barsoukov et al.

(10) Patent No.: US 6,892,148 B2
(45) Date of Patent: *May 10, 2005

(54) CIRCUIT AND METHOD FOR MEASUREMENT OF BATTERY CAPACITY FADE

(75) Inventors: Evgenij Barsoukov, Dallas, TX (US); Dan R. Poole, Austin, TX (US); David L. Freeman, McKinley, TX (US)

(73) Assignee: Texas Instruments Incorporated, Dallas, TX (US)

(*) Notice: Subject to any disclaimer, the term of this patent is extended or adjusted under 35 U.S.C. 154(b) by 3 days.

This patent is subject to a terminal disclaimer.

(21) Appl. No.: 10/428,704

(22) Filed: May 2, 2003

(65) Prior Publication Data

US 2004/0220758 A1 Nov. 4, 2004

Related U.S. Application Data

(60) Provisional application No. 60/437,470, filed on Dec. 29, 2002.

(51) Int. Cl.[7] .............................................. G01R 31/36
(52) U.S. Cl. ........................ 702/63; 320/132; 324/427; 702/65
(58) Field of Search ................................ 702/63–67, 71; 320/101, 107, 132, 134, 136; 324/428, 430; 340/636.13

(56) References Cited

U.S. PATENT DOCUMENTS

| | | | |
|---|---|---|---|
| 5,600,230 A | 2/1997 | Dunstan | 340/636.13 |
| 5,650,712 A * | 7/1997 | Kawai et al. | 324/427 |
| 5,652,502 A | 7/1997 | van Phuoc et al. | 702/63 |
| 6,100,666 A | 8/2000 | Ryu | 320/132 |
| 6,317,697 B1 * | 11/2001 | Yoshikawa et al. | 702/63 |
| 6,480,003 B1 | 11/2002 | Ugaji et al. | 324/430 |

* cited by examiner

*Primary Examiner*—John Barlow
*Assistant Examiner*—John Le
(74) *Attorney, Agent, or Firm*—W. Daniel Swayze, Jr.; W. James Brady; Frederick J. Telecky, Jr.

(57) ABSTRACT

The remaining run-time (t_rem) of a battery is determined independently of the condition of the battery and the amount of load on the battery by obtaining the value of a present total zero-current capacity (Qmax) of the battery based on relaxed-battery OCV values measured just before and just after a charging or discharging cycle. A current through the battery is integrated to determine a transfer of charge (Q) from the battery, and a value of total run-time (t_total) that would be required to reduce the open circuit voltage of the battery to a predetermined lower limit (Vmin) is determined. The remaining run-time (t_rem) is determined by subtracting the duration of the integrating from the total run-time (t_total).

24 Claims, 4 Drawing Sheets

CIRCUIT AND METHOD FOR MEASUREMENT OF BATTERY CAPACITY FADE

This application claims priority under 35 USC § 119 of provisional application Ser. No. 60/437,470, filed Dec. 29, 2002.

BACKGROUND OF THE INVENTION

The present invention relates generally to circuits and techniques for providing an accurate indication of the present "depth of discharge" (DOD) of a rechargeable battery, and particularly to such circuits and techniques that avoid the need to fully charge and then immediately fully discharge the battery in order to obtain an accurate DOD value in spite of fade of the full charge capacity of the battery in the course of repeated use.

It is well known that a no-load measurement of the terminal voltage of a battery (or cell thereof) is an accurate indication of its DOD if the battery has been in a no-load condition for a substantial amount of time, which may be from approximately half an hour to several hours. It also is well-known that an estimate of the "remaining run-time" of a battery operated device is dependent on accurate knowledge of the presently available energy that remains stored in the battery, and that the maximum energy storage capacity of a battery decreases, i.e., "fades", substantially with the "age" of the battery.

Note that the "age" of a battery is generally understood to refer more to the number of charge/discharge cycles to which the battery has been subjected than to the actual amount of time that the battery has existed. In some applications, the battery capacity fade with age must be determined in order to provide accurate estimates for the amount of energy presently stored in the battery, so that the remaining run-time of the battery-powered device can be accurately determined. The presently known methods of determining the amount of battery capacity fade are based on a complete discharging of the battery from a fully charged condition.

However, it is often inconvenient to the user to ensure both that the battery is initially fully charged and then is immediately fully discharged as is required for the prior methods of determining battery capacity fade. Typically, such a full discharge occurs only by chance, and rarely (or never) happens in actual use of the battery to power a device. Instead, most battery operated systems such as electronic notebooks, laptop computers, mobile phones, personal digital assistants (PDAs) and the like do not provide continuous heavy loading on the battery, but instead are characterized by short periods of high current drain on the battery and long periods of relative inactivity in "off" or "standby" conditions.) Consequently, battery capacity fade usually is not properly determined during the long intervals between the rare occurrences wherein the battery is fully discharged immediately after being fully charged. Therefore, the accuracy of the terminations of remaining run-time become less and less accurate as the battery "ages".

Although certain corrections of battery capacity calculations can be performed numerically using previously measured data representing the dependency of battery capacity fade based on the number of prior charge/discharge cycles of the battery and the amount of total cumulative charge that has passed through the battery, such corrections require time-consuming collection of data that is specific to each particular model or type of battery. Furthermore, such data usually is quite imprecise because battery capacity fade is heavily dependent on the various conditions of the battery usage, such as temperature, frequency of charging/discharging, etc. An additional complication is that the battery voltage measurement used to determine when the discharge of the battery is complete is heavily dependent on variable loading of the battery, and that corrections therefore require techniques that are time-consuming and expensive because the corrections need to consider transient loading effects and battery-specific data. These considerations all make it very difficult to provide the estimates of battery capacity fade that are needed for generating an accurate determination of remaining run-time of the battery powered device.

Attempts have been made to use voltage under load to determine remaining capacity of the battery. However, that requires correction for voltage drop due to internal impedance of the battery. Due to complex nature of internal impedance, voltage drop generally depends on the battery relaxation time since the most recent load change, which makes this method very imprecise in the case of variable loads. Additionally, precise knowledge of battery impedance is needed for such correction. However, battery impedance varies as much as +−15 percent even in newly manufactured battery cells. The battery impedance also depends strongly on temperature (about 1.5 times the change with 10 degree Centigrade change of temperature) and increases by a factor of roughly 2 during first ⅕ of battery life, but the amount of this increase can not be precisely predicted. All of these elements of uncertainty make the estimation of remaining battery capacity based on battery voltage under load very imprecise and no longer satisfactory for the rapidly growing reliability needs of users of battery powered mobile devices.

Thus, there is an unmet need for an improved battery measurement system and method that provides an accurate present estimate of battery capacity despite fade in battery capacity due to aging so as to allow generation of an accurate indication of remaining run-time of a battery powered device.

There also is an unmet need for an improved battery measurement system and method that reduces or eliminates the need for collecting data for each particular battery model in order to provide a basis for accurate determination of battery capacity for the purpose of determining remaining run-time run-time.

There also is an unmet need for an improved battery measurement system and method that avoids the need for correction for battery self-discharge in order to accurately determine battery capacity.

There also is an unmet need for an improved battery measurement system and method that avoids the large uncertainty associated with low rate discharge in determining battery capacity.

There also is an unmet need for an improved battery measurement system and method that avoids the need for providing a full battery charge followed by a full discharge in order to obtain an accurate determination of battery capacity.

There also is an unmet need for an improved battery measurement system and method that allows the state of charge determination to be based on a single small database suitable for most batteries of a particular chemistry.

There also is an unmet need for an improved battery measurement system that does not rely on correction for the voltage drop due to internal battery impedance, which is subject to large uncertainties due to transient effects and is not capable of precise estimation.

SUMMARY OF THE INVENTION

It is an object of the present invention to provide an improved battery measurement system and method that provides an accurate present estimate of remaining battery charge despite fade in fully-charged battery capacity due to aging so as to allow generation of an accurate indication of remaining run-time of a battery powered device.

It is another object of the present invention to provide an improved battery measurement system and method that reduces or eliminates the need for collecting data specific to a particular battery model in order to provide a basis for accurate determination of battery capacity for the purpose of determining remaining run-time run-time.

It is another object of the present invention to provide an improved battery measurement system and method that avoids the need for correction for battery self-discharge in order to accurately determine battery capacity.

It is another object of the present invention to provide an improved battery measurement system and method that avoids the large uncertainty associated with low rate discharge in determining battery capacity.

It is another object of the present invention to provide an improved battery measurement system and method that avoids the need for providing a full battery charge followed by a full discharge in order to obtain an accurate determination of battery capacity.

It is another object of the present invention to provide an improved battery measurement system and method that allows the state of charge determination to be based on a single small database that is suitable for most batteries of a particular chemistry.

It is another object of the present invention to provide an improved battery measurement system that does not rely on correction for the voltage drop due to internal battery impedance, which is subject to large uncertainties due to transient effects and is not capable of accurate estimation.

Briefly described, and in accordance with one embodiment, the present invention provides a method of determining a value of zero-current capacity of a battery (Qmax) independently of the condition of the battery including determining that the battery is an a zero-current relaxed state, measuring a starting open circuit voltage (OCV0), partially discharging the battery and integrating the discharging current to determine the amount of charge transferred, and then allowing the battery to relax, measuring an ending open circuit voltage (OCV1), obtaining a starting depth of discharge (DOD0) corresponding to the starting open circuit voltage (OCV0) and an ending depth of discharge (DOD1) corresponding to the ending open circuit voltage (OCV1), and determining the value of the present zero-current capacity (Qmax) by dividing the amount of charge transferred during step (iii) by the difference between the ending depth of discharge (DOD1) and the starting depth of discharge (DOD0).

In another embodiment, the invention provides a method and system for determining a present capacity of a battery delivering a load current by obtaining a value of the present total zero-current capacity (Qmax) of the battery by determining that the battery is an a zero-current relaxed state, measuring a starting open circuit voltage (OCV0), partially discharging the battery and integrating the discharging current to determine the amount of charge transferred. The battery then is allowed to relax, and an ending open circuit voltage (OCV1) is measured. A starting depth of discharge (DOD0) corresponding to the starting open circuit voltage (OCV0) and an ending depth of discharge (DOD1) corresponding to the ending open circuit voltage (OCV1) are obtained, and the value of the present zero-current capacity (Qmax) is determined by dividing the amount of charge transferred by the difference between the ending depth of discharge (DOD1) and the starting depth of discharge (DOD0). The last measured value of open circuit voltage (OCV) is used to determine the starting depth of discharge (DOD0) of the present discharge or charge cycle. The current flows through the battery in the course of the discharge or charge cycle, and is integrated to determine the net transfer of charge from the battery. The change in depth of discharge ($\Delta DOD$) which occurred during the transfer of charge is determined by dividing the transfer of charge value by the total zero-current capacity. The change in depth of discharge ($\Delta DOD$) is algebraically added to the value of the starting depth of discharge (DOD0) to obtain the present depth of discharge (DOD) of the battery.

In one embodiment, invention provides a method and system for determining a remaining run-time (t_rem) of the battery independent of the age of the battery by obtaining a value of the present total zero-current capacity (Qmax) of the battery. A current flows through the battery during the course of operation and the current is integrated to determine net transfer of charge from the battery. A value of total run-time (t_total) that would be required to reduce the open circuit voltage of the battery to a predetermined lower limit (Vmin) is determined, and the duration of the integrating also is determined. The remaining run-time (t_rem) is determined by subtracting the duration of the integrating from the total run-time (t_total). In the described embodiment, a database is stored in a memory (15), wherein data of the database represents the relationship between open circuit voltage (OCV) and depth of discharge (DOD) of the battery. A processor (13) is operated to use the database to determine the value of total run-time (t_total) which causes the expression $$OCV(DOD0+t*I/Qmax, T)-I*R\_battery(DOD0+t*I/Qmax, T)$$

to be equal to the predetermined lower limit (Vmin). The processor can utilize the database to determine and update the value of the internal battery resistance (R_battery) as a function of the depth of discharge (DOD) and temperature (T) of the battery.

DETAILED DESCRIPTION OF THE PREFERRED EMBODIMENTS

Figure 1:
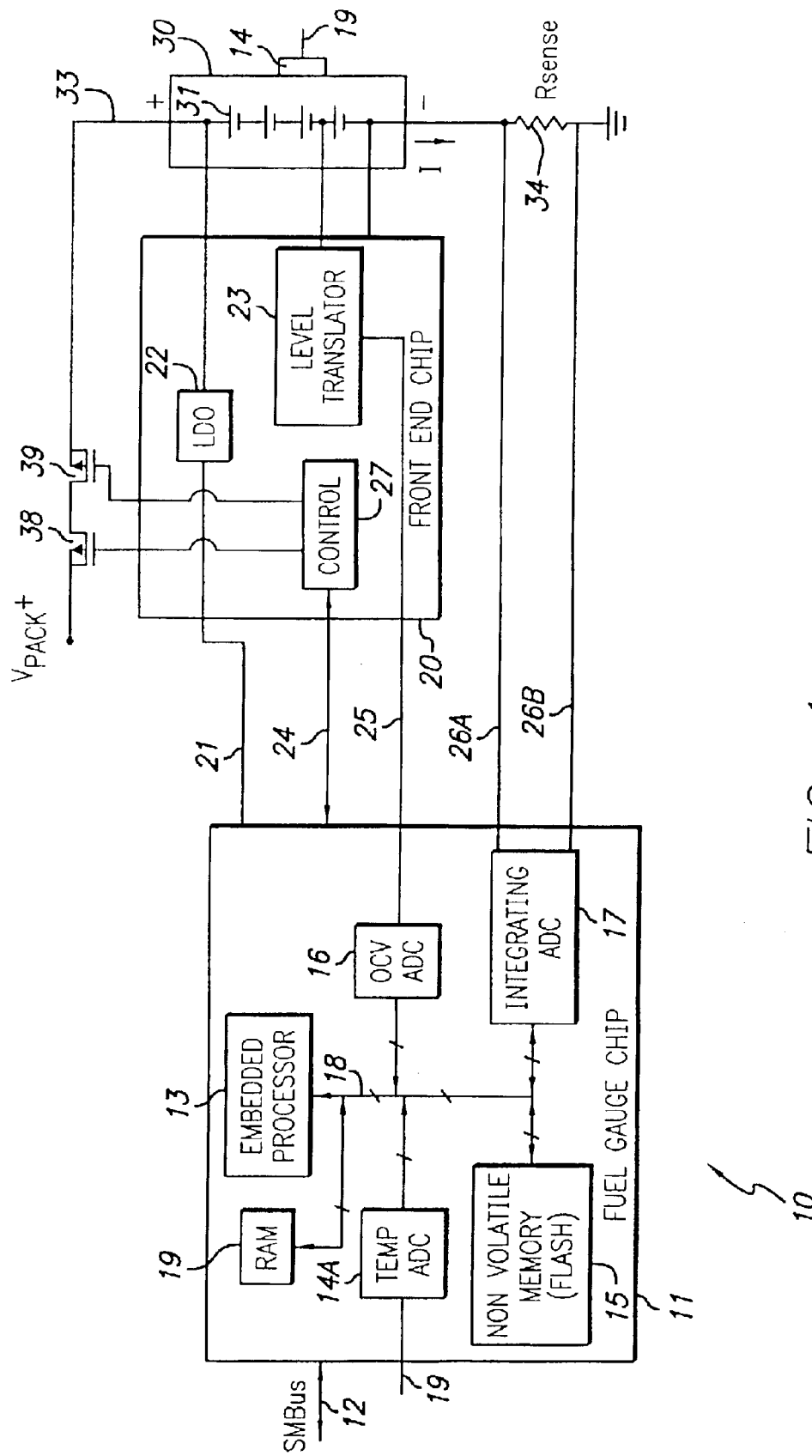
FIG. 1 is a block diagram of a "battery fuel gauge" or battery measurement system which includes a system for determining the capacity of a battery regardless of its age.

Referring to FIG. 1, a "battery fuel gauge system" 10 includes a "battery fuel gauge" integrated circuit chip 11 that includes an embedded processor 13 coupled by a bidirectional digital bus 18 to a temperature sensor circuit 14, a nonvolatile memory 15, a random access memory (RAM) 19, an analog-to-digital converter (ADC) 16, and an integrating analog-to-digital converter 17. The temperature sensor circuit 14 is coupled to an external sensor 19 which is directly attached to the battery 30 shown in FIG. 1. Nonvolatile memory 15 could be a conventional flash memory, ADC 16 and ADC 17 both can be conventional analog-to-digital converters, and embedded processor 13 can, for example, be a commercially available 8 MHz processor having an 8-bit central processing unit (CPU) and a RISC architecture. Various suitable embedded processors that are commercially available can be utilized. For example, the Assignee's MSP430 microprocessor is capable of performing the necessary computations, or an embedded processor such as the one used in the Assignee's BQ8012 fuel gauge chip can be used.

Fuel gauge chip 11 is coupled to a standard SMBus (smart bus) 12 by means of which the fuel gauge chip 11 communicates with another processor (not shown) in accordance with a suitable communications protocol. A conventional interface circuit (not shown) is coupled between SMBus 12 and digital bus 18. Fuel gauge chip 11 is powered by a supply voltage on conductor 21, which is connected to the output of a low dropout (LDO) voltage regulator circuit 22 which is included in a "front end" integrated circuit chip 20. A bidirectional digital bus 24 is coupled between conventional digital interface circuitry (not shown) in accordance with a standard I2IC in integrated circuit 11 and control circuitry 27 in fuel gauge chip 20. Front-end chip 20 also includes a level translator circuit 23 that is coupled by suitable circuitry (not shown) to measure the voltage across one (or more) of the individual lithium-ion cells 31 included in a battery 30 which is used to provide power to a utilization device (not shown) coupled between the "battery pack" terminals V+ and ground. Level translator circuit 23 produces an output that is connected by conductor 25 to the analog input of ADC 16 in integrated circuit 11. I ADC 16 converts the cell voltage to a digital equivalent that can be accessed via digital bus 18 by embedded processor 13.

The total voltage across battery 30 (which can be considered to be equal to the voltage across one of the cells multiplied by the number of cells connected in series) is applied to an input of voltage regulator 22. A 1–100 milli ohm sense resistor 34 is coupled between ground and the (−) terminal of battery 30, and the voltage across sense resistor 34 is applied as an input to integrating ADC 17, which converts the voltage across sense resistor 34 to a digital representation of the battery current flowing through sense resistor 34. The (+) terminal of battery 30 is connected by conductor 33 to the source of a power transistor 39, the gate of which is connected to control circuit 27 and front end chip 20. The drain of power transistor 39 is connected to the drain of power transistor 38, the source of transistor 39 is connected to the battery pack voltage V+, and the gate of transistor 39 is connected to control circuitry 27. The gate of transistors 38 and 39 are controlled in response to signals received by front-end chip 20 from embedded processor 13 via bus 24. Transistor 39 is a discharge transistor and transistor 38 is a charging transistor. Front-end chip 20 includes the conventional interface and control circuitry 27 coupled to bidirectional digital bus 24 in accordance with the standard I2IC protocol in order to control power transistors 38 and 39.

Various information can be sent from fuel gauge chip 11 via digital bus 24 to front-end chip 20 in order to set various levels and to transmit various safety/control information to front-end chip 20, for example to turn the power transistors 38 and 39 on and off under appropriate conditions.

Embedded processor 13 executes a program represented by the subsequently described flowchart of FIG. 3 to effectuate entry of a database representative of characteristics of the battery 30, measurement of open circuit voltages (OCV) of battery 30, and determination of a "starting DOD" that corresponds to the most recently measured value of OCV after the battery has stabilized. Embedded processor 13 also executes programs to determine the present DOD of the battery, the present battery capacity, and the remaining run-time of the device powered by the battery.

Figure 2A:
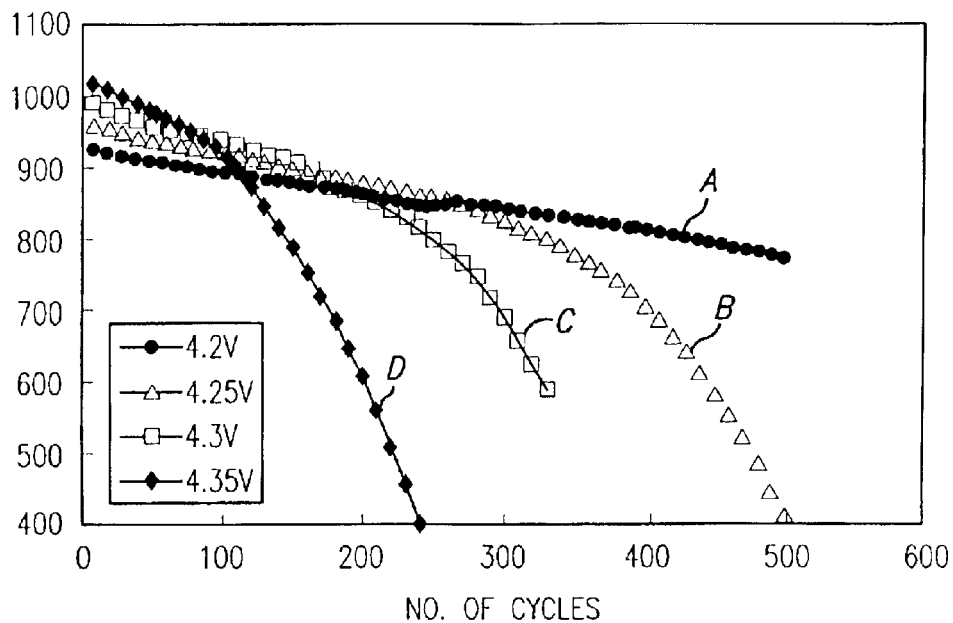
FIG. 2A is a graph illustrating the capacity of a battery for various charging rates as a function of the number of charge/discharge cycles to which the battery has been subjected.
Figure 2B:
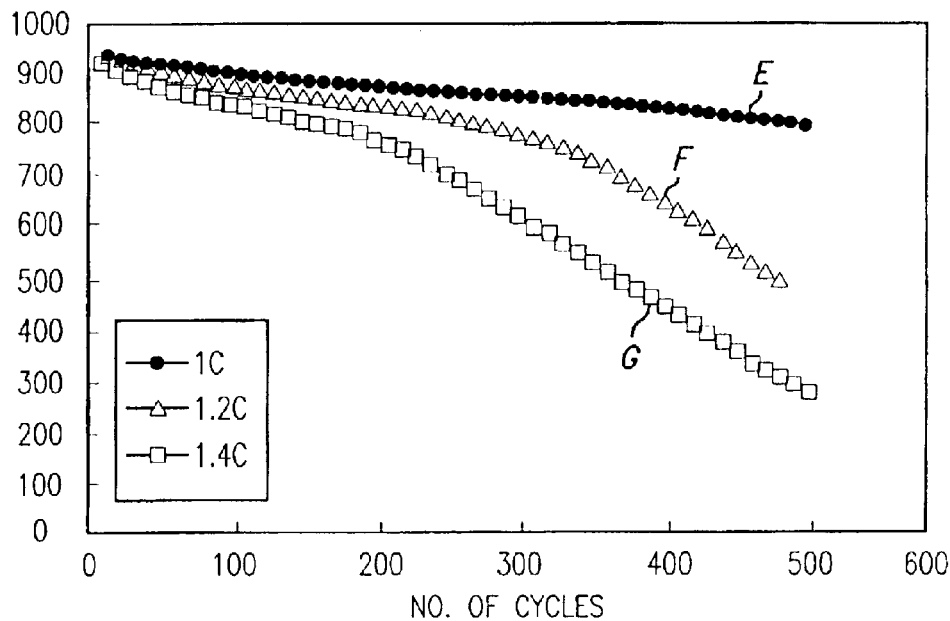
FIG. 2B is a graph of the capacity of a battery for various maximal charging voltages as a function of the number of charge/discharge cycles to which the battery has been subjected.

As indicated previously, the no-load battery voltage is not an accurate indicator of battery depth of discharge (DOD) if a substantial current has been flowing through battery 30 later than approximately half of an hour to several hours prior to the voltage measurement (depending on the particular battery type or various other considerations). FIGS. 2A and 2B show simple curves that illustrate the fade in battery capacity as a function of the number of charge/discharge cycles to which the battery has been subjected. Specifically, FIG. 2A shows the fade of battery capacity vs. the number of charge/discharge cycles as a function of battery charging rates, and FIG. 2B shows the fade of battery capacity as a function of various maximal charging voltages to which the battery is charged. Battery capacity also is degraded further as a function of increased temperature, and also has a function of various other factors. The available capacity of a battery is diminished both by degradation of the maximum no-load capacity of the battery with "age" and by increase of the internal battery resistance with "age".

The total no-load (i.e., no-current) battery capacity (Qmax) is defined as the amount of capacity (i.e., charge) required to pass through the battery to reduce the open circuit voltage OCV from the manufacturer's specified maximum voltage Vmax (e.g., 4.2 volts for a lithium-ion battery) to the manufacturer's specified minimum voltage Vmin (e.g., is 2.7 volts for a lithium-ion battery). By way of definition, the terms "no-load" or "no-current" battery capacity mean that the current flow through the battery is so low as to be not appreciable in its effect on an OCV measurement, and that a sufficient amount of relaxation time has passed since the battery was last subjected to current that the open circuit voltage no longer noticeably changes with time.

The amount of charge actually available from the battery to power a device drawing a substantial amount of load current is less than the total no-load battery capacity because the actual voltage of a battery with a load current flowing through its internal impedance is reduced to the manufacturer's "safe" termination voltage Vmin more quickly for higher values of load current and/or higher values of internal battery impedance due to the voltage drop across the internal battery impedance. This is evident from the equation $$V(DOD)=OCV(DOD)-I*R\_battery(DOD), \quad\quad (Eq.\ 1)$$

where V(DOD) is the battery voltage at a particular DOD and R_battery(DOD) is the battery impedance at that DOD.

The total no-load (i.e., zero-current) battery capacity Qmax is obtained for use as an intermediate parameter in computing the actual available battery capacity at a particular load current I, and is determined from the open-circuit battery voltage OCV0 measured just before the beginning of a particular discharge cycle, the open-circuit battery voltage OCV1 just after the discharge cycle, and the stored database that defines the relationship between DOD and OCV, i.e., DOD (OCV), for the battery. The basic equation for Qmax is $$Qmax = Q/(DOD1-DOD0), \qquad (Eq. 2)$$

where Q is the net or total amount of charge that has passed through the battery during a charge (or discharge) cycle. Since the values of DOD0 and DOD1 at the beginning and end of the particular discharge cycle referred to are obtained from the database relating OCV and DOD, the above equation for Qmax can be more usefully expressed as $$Qmax = Q/[DOD(OCV1,T1)-DOD(OCV0,T0)]. \qquad (Eq. 3)$$

A present remaining capacity Qrem of the battery can be determined by obtaining the value of the product of the present total zero-current capacity Qmax and the quantity (1 minus the present depth of discharge DOD_present.

The DOD(OCV) dependence or characteristic is generally applicable to all batteries having a particular chemistry that represents the variation of OCV with temperature. For example, a comparison of the OCV vs. DOD for four different batteries from four different manufacturers shows that the OCVs do not differ by more than approximately 5 millivolts, so the same database can be used for all (e.g., lithium ion) batteries of the same chemistry. Each OCV measurement is made for a known DOD, the first OCV measurement being made when the battery has been fully charged and relaxed. Similarly, the next OCV measurement is made after a known amount of charge has been discharged from the battery and it has relaxed, so the second DOD is known, and so forth for each additional OCV measurement, until one of the successively measured OCV values is reduced to manufacturer's Vmin.

Qmax, the total or fully-charged zero-current capacity of the battery, is computed no more than once for each charge/discharge cycle, from the OCV value immediately before the beginning of the charge/discharge cycle, the OCV value of immediately after the end of the charge/discharge cycle, and the external charge Q which flows through the battery during the charge/discharge cycle.

As subsequently explained, the remaining run-time for the present battery-powered device can be computed from Qmax.

Figure 2C:
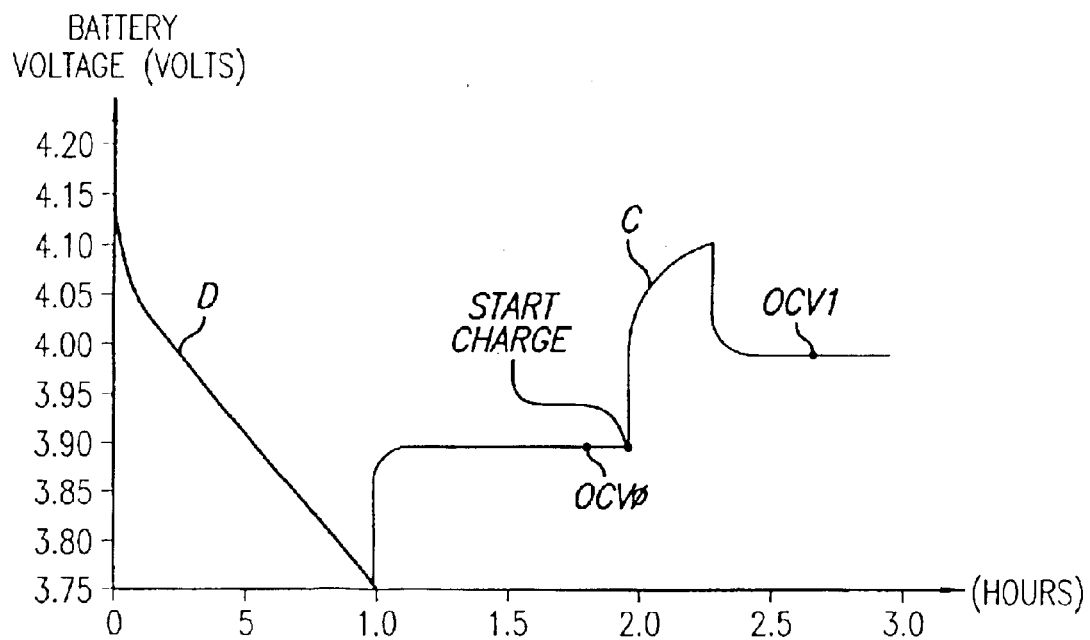
FIG. 2C is a graph of a battery relaxation curve illustrating open-circuit battery voltage as a function of time before and after a charging cycle.
Figure 2D:
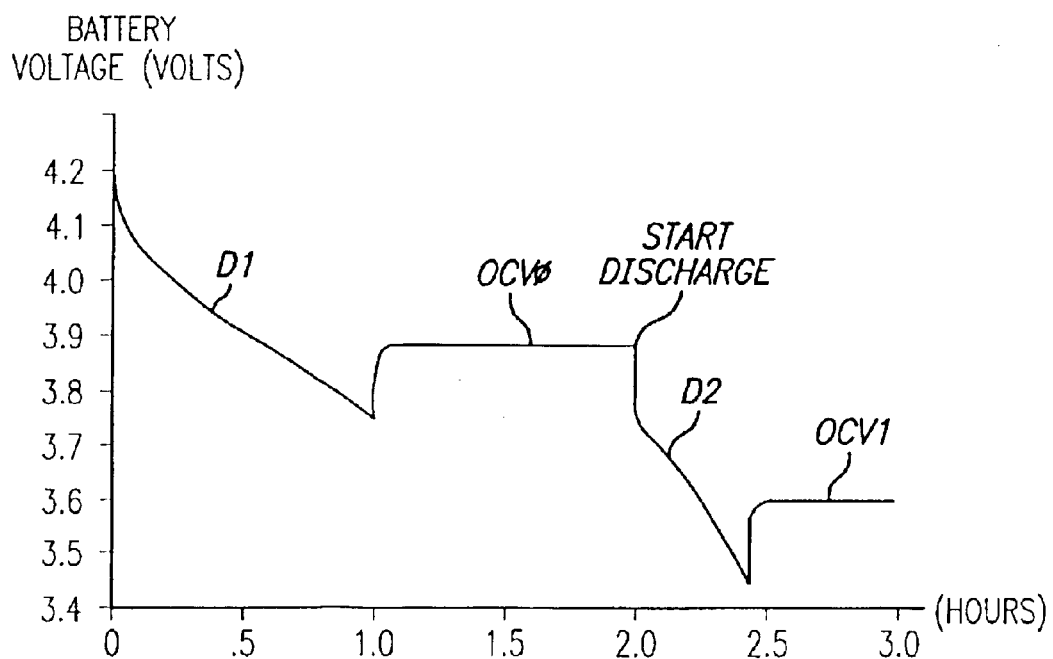
FIG. 2D is a graph of a battery relaxation curve illustrating open-circuit battery voltage as a function of time before and after a discharging cycle.

In accordance with the present invention, the open circuit battery voltage OCV is measured (or determined on the basis of cell voltage measurements) at various times after sufficiently long relaxation intervals during which the battery is not appreciably loaded. The most recent OCV measurement before a discharge cycle is utilized to determine a corresponding starting DOD from a characteristic curve represented by a look-up table that correlates no-load cell voltage measurements of the "relaxed" battery to its present DOD values. Similarly, an OCV measurement after the discharge cycle has ended and the battery has relaxed is utilized to determine a corresponding ending DOD from the lookup table, and Qmax is determined on the basis of the starting DOD and ending DOD of the discharge cycle. Appropriate times for the measurement of OCV0 after battery 30 has relaxed from a discharge cycle D and for the measurement of OCV1 after a charging cycle C are illustrated in FIG. 2C. Similarly, appropriate times for the measurement of OCV0 after battery 30 has relaxed from a discharge cycle D1 and for the measurement of OCV1 after the battery has relaxed from a another discharge cycle D2 are illustrated in FIG. 2D.

When a value of Qmax based on the present "age" of the battery is known, and a starting DOD for a present discharge cycle also is known, a conventional battery monitor circuit (such as the combination of sense resistor 34 and integrating D/A converter 17, or other implementation such as a simple ADC having its output integrated by a processor, or an implementation based on use of the voltage-to-frequency converter) can be used to integrate the load current I supplied to the battery-powered device to obtain a precise value of the total charge Q supplied by the battery. The DOD change ($\Delta$DOD) which occurred during the present discharge is equal to the charge supplied by the battery divided by the maximum possible charge Qmax. This DOD change $\Delta$DOD is subtracted from the most recent starting DOD i.e., DOD0, and the result provides an accurate indication of the present DOD, from which the presently stored charge can be determined and utilized to determine the remaining discharge time of the battery. On the other hand, if Qmax is not yet known, then two DOD points are required, one before and one after the charge or discharge, and the charge Q transferred during the time between those two points also is required, in order to determine Qmax.

To obtain the data needed for the above-mentioned stored table, is necessary to measure K values of OCV at known corresponding values of DOD at each of N temperatures T1, T2 . . . TN. Then, to generate the database, a linear regression is performed for the first of the DOD values obtained by measuring the OCV for the first DOD for each temperature T1, T2 . . . TN in order to provide data on which a linear regression can be performed to obtain intercepts A[k] and slopes B[k] for the straight-line equations represented by $$V[k](T)=A[k]+B[k]*T, \qquad (Eq. 4)$$

where k represents the first of the K DOD values of the battery. Then the procedure is repeated for the remaining DOD values, so there are K equations having the form of Equation 4. The database stored in nonvolatile memory 15 of FIG. 1 includes the intercepts A[k] and slopes B[k]. Note that the A[k] and B[k] intercept and slope values are actually stored in the database, but that neither the values of DOD or T are stored in the database. If the algorithm receives the temperature T and DOD as inputs, it can compute the corresponding OCV, i.e., the corresponding value of V[k](T) using Equation (4).

Since no analytical expression for DOD as a function of T and OCV is available, the K Equations 4 are solved iteratively to obtain the needed value of DOD from known corresponding values of OCV and T.

Figure 3:
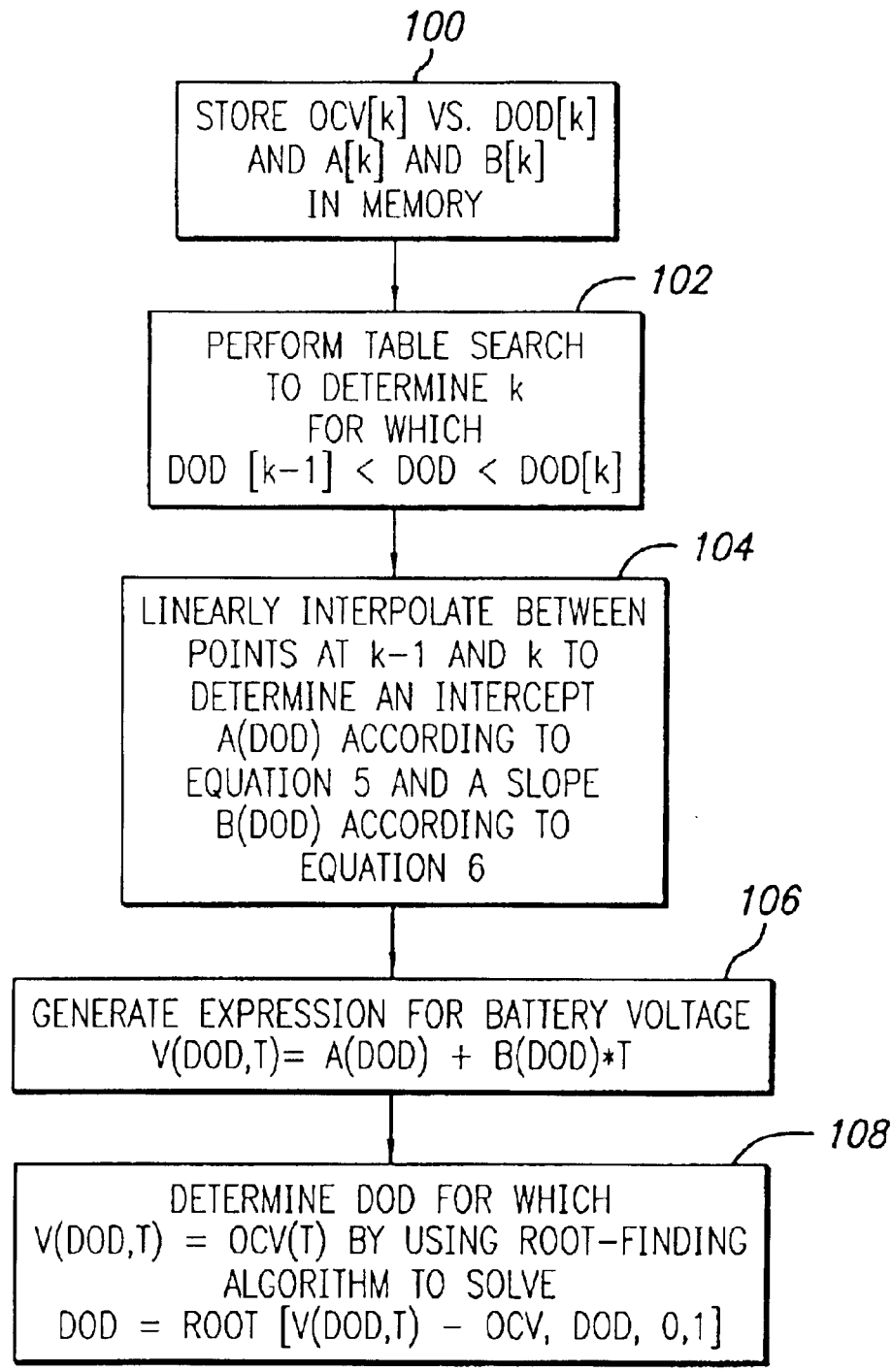
FIG. 3 is generalized flow chart of a program executed by the embedded processor in the battery measurement system of FIG. 1 to 2 determine the values of DOD needed to compute the value of Qmax needed for determining remaining run-time of a device powered by the battery.

The flow chart of FIG. 3 indicates how embedded processor 13 of FIG. 1 uses the stored database to the determine DOD(OCV) i.e., to determine DOD as a function of both OCV and temperature T.

As indicated in block 100 of FIG. 3, the above-mentioned table of A[k] and B[k] required to interpolate the expression for V(DOD,T) is loaded into memory 15 of FIG. 1. As indicated in block 102 of FIG. 3, a table search of the database is performed using a conventional database search algorithm to find a value of the index "k" so that the particular DOD satisfies the expression $$DOD[k-1]<DOD<DOD[k].$$

Once a value of k satisfying this expression is found, an intercept A(DOD) and slope B(DOD) can be found by linear interpolation between the database points A[k−1], DOD[k−1] and A[k] and DOD[k], and B[k−1], DOD[k−1] and B[k] and DOD[k] as indicated in Equations 5 and 6:

$$A(DOD) = \frac{A_{k-1} \cdot DOD_k - DOD_{k-1} \cdot A_k}{DOD_k - DOD_{k-1}} + \frac{A_k - A_{k-1}}{DOD_k - DOD_{k-1}} \cdot DOD \qquad (Eq. 5)$$

$$B(DOD) = \frac{B_{k-1} \cdot DOD_k - DOD_{k-1} \cdot B_k}{DOD_k - DOD_{k-1}} + \frac{B_k - B_{k-1}}{DOD_k - DOD_{k-1}} \cdot DOD. \qquad (Eq. 6)$$

Block 104 of FIG. 3 indicates the computation of the intercept coefficient and slope so as to provide linear interpolation between the k−1 and k points of the above-mentioned database. The table search mentioned above is used to determine the index k used in the above equations and can be performed using various known table search algorithms, such as bi-section table search algorithms.

As indicated in block 106 of FIG. 3, the coefficients A(DOD) and B(DOD) can be thought of as coefficients for determining the temperature dependence of V(DOD,T), or as the intercepts and slopes which define the straight line equation $$V(DOD,T)=A(DOD)+B(DOD)*T. \qquad (Eq. 7)$$

The term V(DOD,T) of Equation 7 provides the battery voltage as a function of the interpolated DOD and the temperature T of the battery at the time when the corresponding OCV was measured.

Block 108 of FIG. 3 indicates the process of using a conventional root-finding algorithm to find a value of DOD that satisfies the expression OCV=V(DOD,T). As is the usual procedure, the root-finding algorithm uses a maximum possible root value of 1 and a minimum possible root value of 0 to bracket the value of the root to be determined in order to simplify the root-finding process. The root-finding process to be performed by the root-finding algorithm can be mathematically expressed by $$DOD = \text{root } [(V(DOD,T)-OCV, DOD, 0, 1)], \qquad (Eq. 8)$$

which indicates that the root, or value of DOD, which causes V(DOD,T)−OCV to be equal to 0 is iteratively determined according to the root-finding algorithm, within the boundaries 0 and 1.

Various well-known table-searching algorithms and root-algorithms can be readily utilized in the flow chart of FIG. 3. For example, see "Numerical Recipes in Fortran, Second Edition", William H. Press, Saul A. Teukolsky, William T. Vetterling, Brian P. Flannery, Cambridge University Press, 1992; for "Table-search" algorithms see page 110, and for "Root-finding" algorithms, see page 343.

The remaining run-time is computed from Qmax, and the battery impedance is taken into consideration.

The determination of remaining run-time of the battery-powered device can be accomplished using the present value of Qmax as determined above, without regard to the new battery value Qmax_new. To accomplish this, the expression $$DOD = DOD0 + t*I/Q\text{max}, \qquad (Eq. 9)$$

where DOD0 is the starting DOD obtained using the above mentioned algorithms, and I is the load current that has been flowing for the battery for the amount of time t since the beginning of the present discharge cycle, is substituted into above Equation 1, to provide $$V(DOD0+t*I/Q\text{max})=OCV(DOD0+t*I/Q\text{max})-I*R\_\text{battery}-(DOD0+t*I/Q\text{max}).$$

The time variable t in Equation 10 is iterated by a conventional algorithm executed by embedded processor 13 to find a value of t which causes the battery voltage given by Equation 10 to be equal to the manufacturer's termination value Vmin. That value of t represents the total run-time t_total that could be supplied to the present load by the battery at the time at which the present discharge cycle started. The remaining run-time t_rem, i.e., the amount of time (measured from the present time) during which the battery (at its present depth of discharge) can continue to supply the present discharge current before the battery voltage decreases to Vmin, is computed by embedded processor 13 from the expression $$t\_\text{rem}=t\_\text{total}-\text{duration of present discharge cycle}. \qquad (Eq. 11)$$

The above-mentioned capacity fade is the change from the original new battery zero-current capacity Qmax_new to the present value of zero-current capacity Qmax. The capacity fade can be expressed as a percentage of Qmax_new by means of the expression $$(Q\text{max}\_\text{new}-Q\text{max})*100/Q\text{max}\_\text{new}, \qquad (Eq. 12)$$

or as a capacity retention fraction by means of the expression $$Q\text{max}/Q\text{max}\_\text{new}. \qquad (Eq. 13)$$

The battery zero-capacity fade then can be expressed to the user in either of the foregoing forms, for example to indicate to the user when the battery should be replaced.

Furthermore, maximum useable capacity (Quseable) at the average current of the present load can be defined as the final DOD (DOD_fin) achieved at the moment when the termination voltage Vmin is reached (at the time t_total), which is subtracted from the DOD achieved at the most recent end of charge (DOD_charge) and the result is multiplied by Qmax. The maximum useable capacity can be calculated as in Eq. 14:

$$Q\text{useable}=(DOD0+I*t\_\text{total}/Q\text{max}-DOD\_\text{charge})*Q\text{max}. \quad (Eq. 14)$$

A "useable capacity fade" corresponding to the above-mentioned "useable capacity" is the change from the original new battery useable capacity Quseable_new to the present value of useable capacity Quseable. The useable capacity fade can be expressed as a percentage of the Quseable_new by means of the expression $$(Q\text{useable}\_\text{new}-Q\text{useable})*100/Q\text{useable}\_\text{new}, \qquad (Eq. 15)$$

or as a useable capacity retention fraction by means of the expression $$Q\text{useable}/Q\text{useable}\_\text{new}. \qquad (Eq. 16)$$

The battery useable capacity fade then can be expressed to the user in either of the foregoing forms, for example to indicate to the user when the battery should be replaced.

"Usable energy" is the total time calculated for a constant power load multiplied by the average power delivered by the battery to the load. Since there is no analytical solution describing the calculation of V(t) for a constant power load, an iterative computing procedure is required. For example, instead of assuming a simple constant current load, constant power and constant resistance loads can be treated by iterative application of Equation (10) in order to determine the time when the termination voltage Vmin is reached.

In the case of a constant power load, the current for each iteration step is determined using Equation (17) below and then is substituted into Equation (10). The current thus obtained is integrated during subsequent iterations to provide a passed charge value Q, which is used to estimate DOD=DOD0+Q/Qmax and to calculate the corresponding OCV value v=OCV(DOD,T) and the corresponding internal battery resistance value R=R(DOD,T) for every step:

$$I(v, R, Pow) = \frac{1}{2 \cdot R} \cdot (\sqrt{v^2 + 4 \cdot R \cdot Pow} - v),$$ (Eq. 17)

where Pow is the average or constant power drawn by the load from the battery. The termination time t_term is determined to be the time when the voltage given by Equation (10) at the current calculated for present step, i.e., iteration, becomes less than Vmin. The usable energy can then be calculated as in Equation (18) below, for the case when iterative calculation started with DOD0=DOD_charge:

$$E\_useable = Pow * t\_term$$ (Eq. 18)

A "useable energy fade" corresponding to the above-mentioned "useable energy" is the change from the original new battery useable energy Euseable_new at the average power load of the current user device or load device to the present value of useable capacity Euseable. The useable energy fade can be expressed as a percentage of the Euseable_new by means of the expression $$(Euseable\_new - Euseable) * 100 / Euseable\_new,$$ (Eq. 19)

or as a useable capacity retention fraction by means of the expression $$Euseable / Euseable\_new.$$ (Eq. 20)

The battery useable energy fade then can be expressed to the user in either of the foregoing forms, for example to indicate to the user when the battery should be replaced.

Pulsed or irregular loads can be treated using current, power or resistance as appropriate, averaged over a certain period of time of the present operation or averaged during a previous operation. Therefore, the present invention can be applied to any battery powered device regardless of its load behavior. More complex equations can be used instead of Equation (10) to determine the impedance effect on the terminal voltage of the battery, for example by incorporating transient effects and non-linear dependence of battery impedance on current. In particular, a more or less complex form of this equation can be selected depending on available computing power, and still remain within the scope of present invention.

The above described invention avoids the need for a fully charged (or nearly fully charged) starting condition of the battery and an immediate full discharge (or nearly full discharge) of the battery in order to provide an accurate indication of the present charge stored in the battery that takes into account the battery fade associated with the "age" of the battery.

The need to calculate predicted battery capacity fade based on the amount of charge that has passed through the battery or the number of charge/discharge cycles which the battery has undergone is avoided, and the time-consuming collection of battery-specific aging data is avoided. Furthermore, the above described method does not require complex corrections of measured battery voltages under load conditions and therefore avoids errors associated with such corrections and avoids the need to provide databases which can be used in making such corrections.

The described invention has the advantage that the battery powered device does not have to be taken out of service in order to allow a full charging and subsequent discharging of the battery to allow accurate remaining run-time of the battery powered device to be computed. Instead, the battery capacity update can be performed during or after charging, and the total battery charge capacity is always up-to-date. This ensures that the present indication of remaining run-time of the battery powered device is always accurate.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention.

For example, other expressions can be used to report the capacity or capacity fade as derived from the values produced by current invention, for example in the form of reduction of useable run-time, reduction of useable energy etc. OCV and temperature can be measured on single cell of a battery pack, or the average value of all cells in the battery pack can be used. Also, OCV can be measured not only under the condition of zero battery current, but also under the condition of a non-zero current that is sufficiently low so as not to introduce significant error. Accordingly, and by way of definition, the term "zero-current" as used herein to refer to battery current includes non-zero battery current that is sufficiently low that it does not introduce significant error in the determination of the OCV of the battery. Determination of the moment when the OCV is considered sufficiently relaxed can be accomplished by using fixed time, time made dependent on temperature or expected DOD, or through observing the derivative of the voltage change. Measurement of the OCV prior to each usage of battery powered device can be accomplished by making the OCV measurement after predefined periods of time when battery is not in use and taking the last one measured before usage is started, or by activating the measurement by the same control activating the battery powered device. When current flowing through the battery is small (i.e., not causing a voltage drop more than 1–2% of battery voltage) but is high enough to be measured, correction of voltage drop due to battery impedance can be made with good precision using the simple model OCV=V−I*R(DOD). This is due to the fact that non-linear effects are negligible at low current, and transient effects are absent because the battery current was not changing for a long time. On the other hand, the R(DOD) dependence is usually smooth, since the error in resistance estimation due to deviation of DOD estimated from the measured voltage value without correction from the "true value" will be negligible. The corrected OCV can be then used to obtain an improved value of DOD as described above, to increase method's accuracy for the cases where battery current during passive phase is small but measurable.

What is claimed is:

1. A method of determining a present zero-current capacity of a battery independent of the condition of the battery, comprising:
   (a) determining that the battery is in a zero-current relaxed state;
   (b) measuring a starting open circuit voltage of the battery;
   (c) integrating a measurable current flowing for the battery to determine an amount of charge transferred, and then determining that the battery is in a zero-current relaxed state;
   (d) measuring an ending open circuit voltage of the battery;
   (e) obtaining a starting depth of discharge corresponding to the starting open circuit voltage and an ending depth of discharge corresponding to the ending open circuit voltage; and
   (f) determining the present zero-current capacity by dividing the amount of charge transferred during step (c) by a difference between the ending depth of discharge and the starting depth of discharge.

2. A method of determining a present capacity of a battery delivering a load current, comprising:
   (a) obtaining a value of a present total zero-current capacity of the battery by performing the steps of
      i. determining that the battery is an a zero-current relaxed state,
      ii. measuring a starting open circuit voltage of the battery,
      iii. partially discharging the battery and integrating the discharging current to determine an amount of charge transferred, and then allowing the battery to relax,
      iv. measuring an ending open circuit voltage of the battery,
      v. obtaining a starting depth of discharge corresponding to the starting open circuit voltage and an ending depth of discharge corresponding to the ending open circuit voltage, and
      vi. determining the present total zero-current capacity by dividing the amount of charge transferred during step (a)(iii) by a difference between the ending depth of discharge and the starting depth of discharge;
   (b) using a last measured value of open circuit voltage to determine a starting depth of discharge of a present discharging or charging cycle;
   (c) causing a battery current to flow through the battery in the course of the present discharging or charging cycle;
   (d) integrating the battery current to determine a total transfer of charge to or from the battery;
   (e) determining a change in depth of discharge which occurred during the total transfer of charge by dividing the total transfer of charge by the present zero-current capacity; and
   (f) algebraically adding the change in depth of discharge to the starting depth of discharge to obtain a present depth of discharge of the battery.

3. The method of claim 2 including determining a present remaining capacity of the battery by determining the value of the product of the present total zero-current capacity and the quantity 1 minus the present depth of discharge.

4. The method of claim 2 including expressing a capacity fade of the battery either as a percentage of a new zero-current capacity of the battery according to the expression $$(Q_{max\_new} - Q_{max})*100/Q_{max\_new}$$

or as a capacity retention fraction according to the expression $$Q_{max}/Q_{max\_new}.$$

5. The method of claim 2 including determining a maximum usable capacity at an average value of the load current according to the expression $$Q_{useable} = (DOD0 + I*t\_total/Q_{max} - DOD\_charge)*Q_{max},$$

where DOD0 is the starting depth of discharge, I is the average value of the load current, t_total is a total run-time that would be required to reduce the terminal voltage of the battery to a predetermined lower limit, Qmax is the present total zero-current capacity of the battery, and DOD_charge is the depth of discharge of the battery at the end of a most recent charging.

6. The method of claim 5 including expressing a usable capacity fade of the battery either as a percentage of a new zero-current capacity of the battery according to the expression $$(Q_{useable\_new} - Q_{useable})*100/Q_{useable\_new},$$

or as a useable capacity retention fraction by means of the expression $$Q_{useable}/Q_{useable\_new}.$$

7. A method of determining a remaining run-time of a battery independently of the age of the battery, comprising:
   (a) obtaining the value of a present total zero-current capacity of the battery;
   (b) determining a net transfer of charge from the battery caused by flow of a current through the battery;
   (c) determining a value of total run-time that would be required to reduce the terminal voltage of the battery from a predetermined starting value to a predetermined lower limit and also determining the duration of the flow of the current; and
   (d) determining the remaining run-time by subtracting the duration of the flow of the current from the total run-time.

8. The method of claim 7 including
   i. storing a database in a memory, data of the database representing the relationship between the open circuit voltage and the depth of discharge of the battery,
   ii. wherein the determining of step (d) includes operating a processor utilizing the database to determine the value of total run-time which causes the expression $$OCV(DOD0+t*I/Q_{max}, T) - I*R\_battery(DOD0+t*I/Q_{max}, T)$$

to be equal to the predetermined lower limit, wherein T is the battery temperature, I is the current flowing through the battery, and R_battery(DOD0+t*I/Qmax, T) is the internal resistance of the battery, wherein the database includes a section including values of R_battery(DOD0+t*I/Qmax, T).

9. The method of claim 8 wherein the determining of step (d) includes performing an iterative computing process to determine a value of total run-time that causes the expression OCV(DOD0+t*I/Qmax, T)−I*R_battery(DOD0+t*I/Qmax, T) to be equal to the predetermined lower limit for a constant power condition or a constant internal battery resistance condition.

10. The method of claim 8 wherein the determining of step (b) includes operating the processor to utilize the database to determine the value of an internal battery resistance as a function of the depth of discharge and temperature of the battery.

11. The method of claim 10 wherein the using of the database to determine the value of the internal battery resistance as a function of the depth of discharge and temperature of the battery is performed to update the value of the internal battery resistance during battery operation.

12. The method of claim 7 wherein step (a) includes
   i. determining that the battery is in a zero-current relaxed state;
   ii. measuring a starting open circuit voltage of the battery;
   iii. partially discharging the battery and integrating the discharging current to determine the amount of charge transferred, and then allowing the battery to relax;
   iv. measuring an ending open circuit voltage of the battery;
   v. obtaining a starting depth of discharge corresponding to the starting open circuit voltage and an ending depth of discharge corresponding to the ending open circuit voltage; and
   vi. determining the value of the present zero-current capacity by dividing the amount of charge transferred during step (iii) by the difference between the ending depth of discharge and the starting depth of discharge.

13. The method of claim 12 including storing a database in a memory, data of the database representing the relationship between the open circuit voltage and the depth of discharge of the battery, wherein the determining of step (d) includes operating a processor utilizing the database to determine the value of t that is equal to a total run-time which causes the expression $$OCV(DOD0+t*I/Qmax, T)-I*R\_battery(DOD0+t*I/Qmax, T)$$

to be equal to the predetermined lower limit, wherein T is the battery temperature, I is the current flowing through the battery, and R_battery(DOD0+t*I/Qmax, T) is the internal resistance of the battery, wherein the database includes a section including values of R_battery(DOD0+t*I/Qmax, T).

14. A method of determining a present usable energy of a battery delivering a load current at a constant power level, comprising:
   (a) obtaining a value of a present total zero-current capacity of the battery by performing the steps of
      i. determining that the battery is an a zero-current relaxed state,
      ii. measuring a starting open circuit voltage of the battery,
      iii. partially discharging the battery and integrating the discharging current to determine an amount of charge transferred, and then allowing the battery to relax,
      iv. measuring an ending open circuit voltage of the battery,
      v. obtaining a starting depth of discharge corresponding to the starting open circuit voltage and an ending depth of discharge corresponding to the ending open circuit voltage, and
      vi. determining the present total zero-current capacity by dividing the amount of charge transferred during step (a)(iii) by a difference between the ending depth of discharge and the starting depth of discharge;
   (b) using a last measured value of open circuit voltage to determine a starting depth of discharge for the delivering of the load current at the constant power level;
   (c) causing the battery to deliver the load current at the constant power level;
   (d) iteratively, recursively performing the functions of
      i. computing values of the load current according to the equation $$I(v, R, Pow) = \frac{1}{2 \cdot R} \cdot \left( \sqrt{v^2 + 4 \cdot R \cdot Pow} - v \right),$$

ii. integrating the computing values of the load current to obtain a passed charge value Q and using it to determine a depth of discharge value DOD=DOD0+Q/Qmax,
      iii. computing a value v according to the expression $$v=OCV(DOD, T)-I(v,R,Pow)*R(DOD,T);$$

(e) determining a termination time t=t_term at which the expression OCV(DOD0+t*I(v,R,Pow)/Qmax)-I(v,R,Pow)*R(DOD0+t*I(v,R,Pow)/Qmax) is equal to a predetermined minimum battery voltage; and
   (f) computing the present usable energy according to the expression E_usable=Pow*T_term.

15. A system for determining a remaining run-time of a battery independently of the age of the battery, comprising:
   (a) a processor coupled to a digital bus, and a memory for storing data representing the relationship between the OCV (open circuit voltage) and DOD (depth of discharge) of the battery, a first ADC, and a second ADC all coupled to the digital bus;
   (b) a first algorithm stored in the memory for execution by the processor to obtain the value of a present total zero-current capacity of the battery in response to both a first open circuit voltage measured while the battery was relaxed and before a first current began flowing through the battery and a second open circuit voltage measured after the first current stopped flowing through the battery and the battery relaxed;
   (c) circuitry including the second ADC and a current sensor for sensing a second current flowing through the battery and integrating the second current with respect to time to determine a transfer of charge to or from the battery; and
   (d) a second algorithm stored in the memory for execution by the processor to determine a value of total run-time that would be required to reduce the open circuit voltage of the battery to a predetermined lower limit and the duration of the integrating and also to determine the remaining run-time by subtracting the duration of the integrating from the total run-time.

16. The system of claim 15 including a temperature sensor in thermal contact with the battery and a third ADC coupled to the digital bus.

17. The system of claim 16 including a database stored in the memory including the data representing the OCV and DOD of the battery as K values of OCV of the battery at known corresponding values of DOD of the battery at each of N temperatures T1, T2 . . . TN, the database also including K intercepts A and K slopes B defining K equations V(T)=A+B*T, wherein k is an index and T is a variable representing the temperature of the battery, and the values A and B have been obtained by linear regression of the OCV and DOD values, wherein the first algorithm utilizes a table search algorithm and a root-finding algorithm in conjunction with the database to determine values of DOD corresponding to values of OCV measured from the battery.

18. The system of claim 17 wherein the second algorithm determines the total run-time by iterating a variable t in the equation $$V(DOD0+t*I/Qmax)=OCV(DOD0+t*I/Qmax)-I*R\_battery(DOD0+t*I/Qmax)$$

to a value that causes OCV(DOD0+t*I/Qmax)−I*R_battery(DOD0+t*I/Qmax) to be equal to the predetermined lower limit and using that value as the total run-time, where I is the second current, DOD0 is a depth of discharge corresponding to the first open circuit voltage, V(DOD0+t*I/Qmax) is the voltage between terminals of the battery as a function of V(DOD0+t*I/Qmax, and R_battery(DOD0+t*I/Qmax) is the internal resistance of the battery as a function of V(DOD0+t*I/Qmax).

19. The system of claim 16 wherein the processor, memory, first ADC, second ADC and third ADC are integrated into a battery fuel gauge chip.

20. The system of claim 19 wherein the memory includes an updatable nonvolatile flash memory.

21. A system for determining a present zero-current capacity of a battery independent of the condition of the battery, comprising:
   (a) means for determining that the battery is in a zero-current relaxed state;
   (b) means for measuring a starting open circuit voltage of the battery;
   (c) means for partially discharging the battery and integrating a discharging current to determine an amount of charge transferred, and then allowing the battery to relax;
   (d) means for measuring an ending open circuit voltage of the battery;
   (e) means for obtaining a starting depth of discharge corresponding to the starting open circuit voltage and an ending depth of discharge corresponding to the ending open circuit voltage; and
   (f) means for determining the present zero-current capacity by dividing the amount of charge transferred during step (c) by a difference between the ending depth of discharge and the starting depth of discharge.

22. A system for determining a present capacity of a battery delivering a load current, comprising:
   (a) means for obtaining a value of a present total zero-current capacity of the battery, including
      i. means for determining that the battery is an a zero-current relaxed state,
      ii. means for measuring a starting open circuit voltage of the battery,
      iii. means for partially discharging the battery and integrating the discharging current to determine an amount of charge transferred, and then allowing the battery to relax,
      iv. means for measuring an ending open circuit voltage of the battery,
      v. means for obtaining a starting depth of discharge corresponding to the starting open circuit voltage and an ending depth of discharge corresponding to the ending open circuit voltage, and
      vi. means for determining the present total zero-current capacity by dividing the amount of charge transferred during step (a)(iii) by a difference between the ending depth of discharge and the starting depth of discharge;
   (b) means for using a last measured value of open circuit voltage to determine the starting depth of discharge of a present discharging or charging cycle;
   (c) means for causing a battery current to flow through the battery in the course of the present discharging or charging cycle;
   (d) means for integrating the battery current to determine a total transfer of charge to or from the battery;
   (e) means for determining a change in depth of discharge which occurred during the total transfer of charge by dividing the total transfer of charge by the present zero-current capacity; and
   (f) means for algebraically adding the change in depth of discharge to the starting depth of discharge to obtain a present depth of discharge of the battery.

23. The system of claim 22 including means for determining a present remaining capacity of the battery by determining the value of the product of the present total zero-current capacity and the quantity (1 minus the present depth of discharge).

24. A system for determining a remaining run-time of a battery independently of the age of the battery, comprising:
   (a) means for obtaining the value of a present total zero-current capacity of the battery;
   (b) means for causing a current to flow through the battery;
   (c) means for integrating the current to determine a transfer of charge from the battery;
   (d) means for determining a value of total run-time that would be required to reduce the open circuit voltage of the battery to a predetermined lower limit and also determining the duration of the integrating; and
   (e) means for determining the remaining run-time by subtracting the duration of the integrating from the total run-time.

* * * * *